(12) United States Patent
Wen et al.

(10) Patent No.: US 12,306,028 B2
(45) Date of Patent: May 20, 2025

(54) JIG FOR AUTOMATICALLY MEASURING FLOW RATE OF RETICLE CARRIER

(71) Applicant: GUDENG EQUIPMENT CO., LTD., New Taipei (TW)

(72) Inventors: Chin-Hung Wen, New Taipei (TW); Chao-Chin Chin, New Taipei (TW); Keng-Liang Lin, New Taipei (TW); An-Pang Wang, New Taipei (TW)

(73) Assignee: GUDENG EQUIPMENT CO., LTD., New Taipei (TW)

( * ) Notice: Subject to any disclaimer, the term of this patent is extended or adjusted under 35 U.S.C. 154(b) by 410 days.

(21) Appl. No.: 18/091,413

(22) Filed: Dec. 30, 2022

(65) Prior Publication Data
US 2024/0219217 A1    Jul. 4, 2024

(51) Int. Cl.
*G01F 15/061* (2022.01)
*G03F 7/00* (2006.01)
*H02J 7/00* (2006.01)
*H02J 50/10* (2016.01)

(52) U.S. Cl.
CPC ........ *G01F 15/061* (2013.01); *G03F 7/70741* (2013.01); *H02J 7/0047* (2013.01); *H02J 50/10* (2016.02)

(58) Field of Classification Search
CPC ..................................................... G01F 15/061
USPC ............................................................ 73/198
See application file for complete search history.

(56) References Cited

U.S. PATENT DOCUMENTS 5,267,292 A * 11/1993 Tanaka ................ G03F 7/70875
378/34
2019/0179230 A1 * 6/2019 Raaymakers ......... G03F 7/2041

* cited by examiner

*Primary Examiner* — Walter L Lindsay, Jr.
*Assistant Examiner* — Philip T Fadul

(57) ABSTRACT

A jig for automatically measuring flow rate of a reticle carrier comprises a jig body, a flow rate detection module, a wireless communication module, a capacitor and a wireless charging receiving module. The jig body has a storage space, at least one gas inlet hole and at least one gas outlet hole communicated to the storage space. The flow rate detection module includes a flowmeter and a flow indicator connected to the flowmeter by a signal, the flowmeter is disposed in the storage space. The wireless communication module is connected to the flowmeter by a signal. The capacitor is electrically connected to the flow rate detection module and the wireless communication module. The wireless charging receiving module is disposed at a bottom of the jig body, and electrically connected to the capacitor.

7 Claims, 4 Drawing Sheets

JIG FOR AUTOMATICALLY MEASURING FLOW RATE OF RETICLE CARRIER

BACKGROUND OF THE INVENTION

1. Field of the Invention

The present disclosure relates to a jig for detecting flow rate, and in particular to a jig for automatically measuring flow rate of a reticle carrier.

2. Description of the Related Art

In the advanced lithography process in the semiconductor field, especially the extreme ultraviolet light (EUV) lithography process, the requirement for cleanliness of the process environment is extremely high. If particles contaminate the reticle, it will cause defects in the photographic process. In order to achieve the requirements for cleanliness and protecting the reticle, a reticle pod is generally used to block external particles. Therefore, the cleanliness of the reticle pod itself is very important. The general cleaning practice is to introduce a clean gas (compressed dry gas or nitrogen) into the reticle pod to remove the particles therein.

However, if the gas flow injected is too high or too low, it may cause deterioration and damage of the reticle or reticle pod. In order to avoid abnormal flow of the supplied gas, the gas flow at the source end of the reticle pod needs to be as stable as possible. Even so, the abnormal gas flow occasionally occurs, and it is difficult to detect the gas flow due to the invisibility of the gas.

BRIEF SUMMARY OF THE INVENTION

Therefore, in order to solve the various problems of the reticle carrier, the disclosure provides a jig for automatically measuring flow rate of a reticle carrier.

To achieve the above objective and other objectives, the present disclosure provides a jig for automatically measuring flow rate of a reticle carrier, which comprises: a jig body, having a storage space, at least one gas inlet hole and at least one gas outlet hole communicated to the storage space; a flow rate detection module, including a flowmeter and a flow indicator connected to the flowmeter by a signal, the flowmeter is disposed in the storage space; a wireless communication module, connected to the flowmeter by a signal; a capacitor, electrically connected to the flow rate detection module and the wireless communication module; and a wireless charging receiving module, disposed at a bottom of the jig body, and electrically connected to the capacitor.

In an embodiment of the present disclosure, the jig for automatically measuring flow rate of the reticle carrier further comprises a power indicator, electrically connected to the capacitor.

In an embodiment of the present disclosure, the jig for automatically measuring flow rate of the reticle carrier further comprises a wireless charging transmitting module, electrically connected to the wireless charging receiving module in a wireless manner.

In an embodiment of the present disclosure, the flow rate detection module further comprises a starting switch, connected to the flowmeter by a signal.

In an embodiment of the present disclosure, the wireless communication module is a Bluetooth communication module.

In an embodiment of the present disclosure, the jig body is provided with a wired charging interface.

In an embodiment of the present disclosure, a top of the jig body is provided with a handle.

Accordingly, the jig for automatically measuring flow rate of the reticle carrier of the present disclosure can detect abnormal gas flow in advance, and it can accurately test the gas supplied by the gas supply source by the flow rate detection module, and transmit and record the value by the wireless communication module and other elements, can regularly check the gas supply source and record the data to learn the state of the gas supply source, and then judge and analyze and prevent abnormal gas flow in advance, thereby reducing the abnormal supply caused by the gas supply source, and decreasing the risk of deterioration and damage to the reticle carrier or reticle.

DETAILED DESCRIPTION OF THE INVENTION

Figure 1:
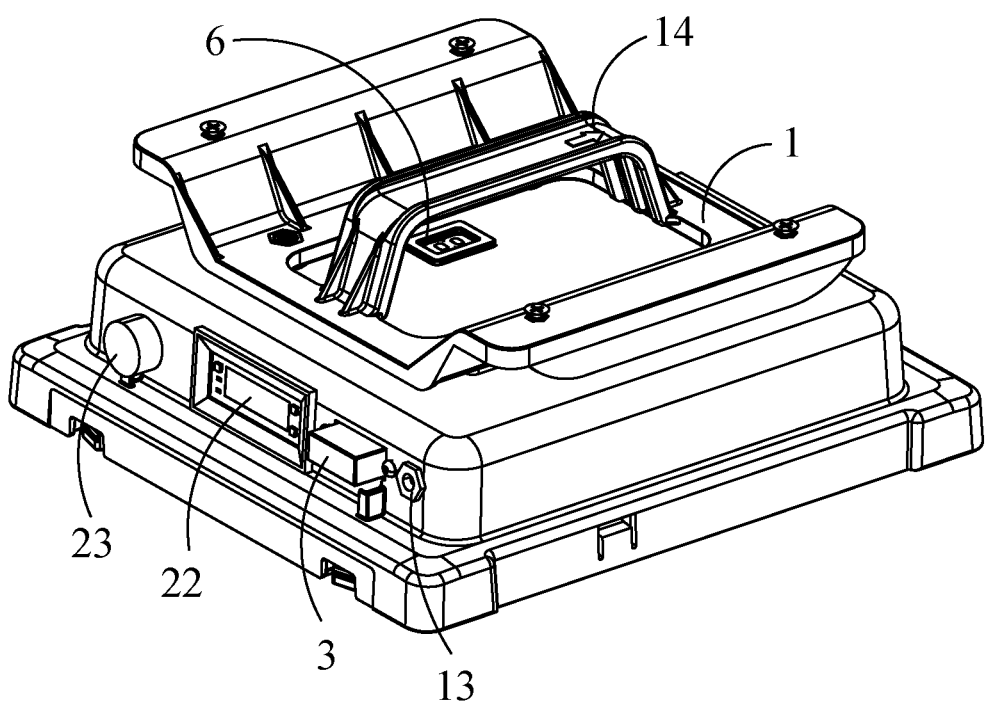
FIG. 1 is a schematic perspective view of a jig for automatically measuring flow rate of a reticle carrier according to an embodiment of the present disclosure.

To facilitate understanding of the present disclosure, embodiments together with the attached drawings for the detailed description of the present disclosure are provided. One skilled in the art can understand the object, characteristics, and effects of this present disclosure by the content described in the specification. It should be noted that various possible modifications and alterations to the details of the specification could be carried out by implementing or applying other different embodiments based on different views and applications without departing from the spirit of the present disclosure. The related technical contents of the disclosure will be described in detail by the embodiments. However, the disclosed contents should not be considered to limit the scope of the disclosure. The description is provided as follows:

As shown in FIGS. 1 to 4, a jig 100 for automatically measuring flow rate of a reticle carrier of an embodiment of the present disclosure comprises: a jig body 1, a flow rate detection module 2, a wireless communication module 3, a capacitor 4, and a wireless charging receiving module 5.

The jig body 1 has a storage space S, at least one gas inlet hole 11 and at least one gas outlet hole 12 communicated to the storage space S. In an embodiment there are two gas inlet holes 11 and two gas outlet holes 12. These gas inlet holes 11 and gas outlet holes 12 penetrate a bottom face of the jig body 1. The specific shape of the jig body 1 may be according to the shape of the reticle carrier. In an embodiment, the jig body 1 is roughly a rectangular box, and a top of the jig body 1 is provided with a handle 14, which makes it convenient to move the jig body 1 in a grasping manner.

The flow rate detection module 2 includes a flowmeter 21 and a flow indicator 22 connected to the flowmeter 21 by a signal, the flowmeter 21 is disposed in the storage space S. The flowmeter 21 is, for example, a flow sensor for measuring liquid, gas, and other fluids, such as a thermal mass flowmeter, diaphragm flowmeter, or ultrasonic flowmeter, and the present disclosure is not limited thereto. The flow indicator 22 is, for example, a liquid crystal display, receives the flow signal measured by the flowmeter 21 and displays it. The flow indicator 22 is preferably disposed on an outer surface of the jig body 1.

The wireless communication module 3 is connected to the flowmeter 21 by a signal. The wireless communication module 3 receives the flow signal measured by the flowmeter 21 and transmits it to an external mechanism. The wireless communication module 3 is, for example, a Bluetooth communication module, which transmits the flow signal to remote computers, mobile phones, and other terminal devices by means of Bluetooth wireless transmission.

The capacitor 4 is electrically connected to the flow rate detection module 2 and the wireless communication module 3 in order to supply power required by the flow rate detection module 2 and the wireless communication module 3. The capacitor 4 is, for example, a rechargeable battery. The wireless communication module 3 may also transmit power of the capacitor 4 to the external mechanism.

The wireless charging receiving module 5 is disposed at a bottom of the jig body 1, and electrically connected to the capacitor 4. When charging the capacitor 4, the wireless charging receiving module 5 is in close proximity to a wireless charging transmitting module 7, and energy is transmitted by magnetic induction or magnetic resonance. The wireless charging transmitting module 7 is provided with a transmitting coil, while the wireless charging receiving module 5 is provided with a receiving coil, and the two coils transmit energy by magnetic field coupling (magnetic induction) or resonance (magnetic resonance). However, the present disclosure is not limited thereto.

In summary, by the jig 100 for automatically measuring flow rate of the reticle carrier of the present disclosure, the abnormal gas flow can be found in advance, and it can accurately test the gas supplied by the gas supply source by the flow rate detection module 2, and transmit and record the value by the wireless communication module 3 and other elements, can regularly check the gas supply source and record the data to learn the state of the gas supply source, and then judge and analyze and prevent abnormalities in advance, thereby reducing the possibility of abnormal gas supply caused by the gas supply source, and decreasing the risk of deterioration and damage to the reticle carrier or reticle.

Further, the jig 100 for automatically measuring flow rate of the reticle carrier further comprises a power indicator 6, electrically connected to the capacitor 4. The power indicator 6 is, for example, a liquid crystal display, and displays power level according to the remaining power of the capacitor 4. The power indicator 6 is preferably disposed on the outer surface of the jig body 1.

Figure 2:
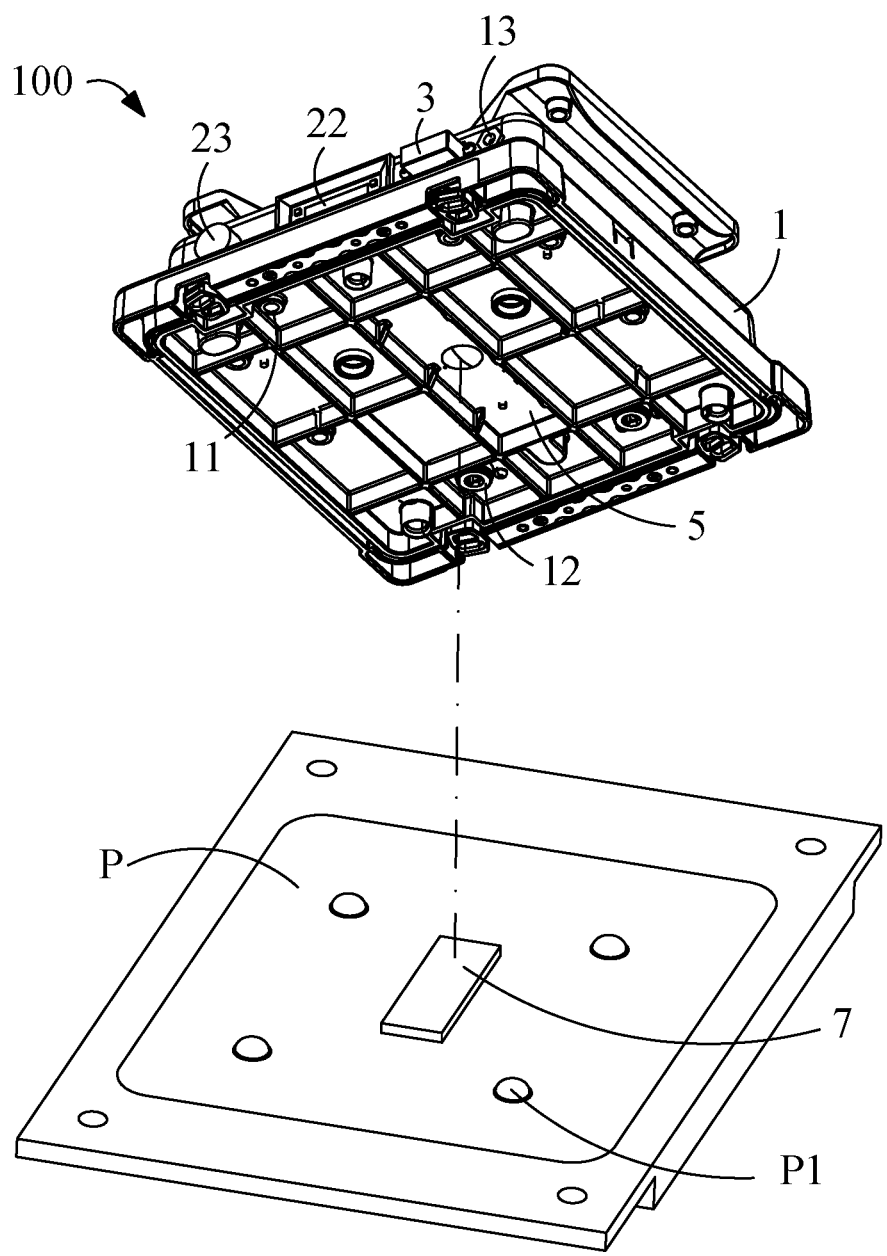
FIG. 2 is a schematic perspective view of the jig for automatically measuring flow rate of the reticle carrier from another viewing angle according to an embodiment of the present disclosure.
Figure 3:
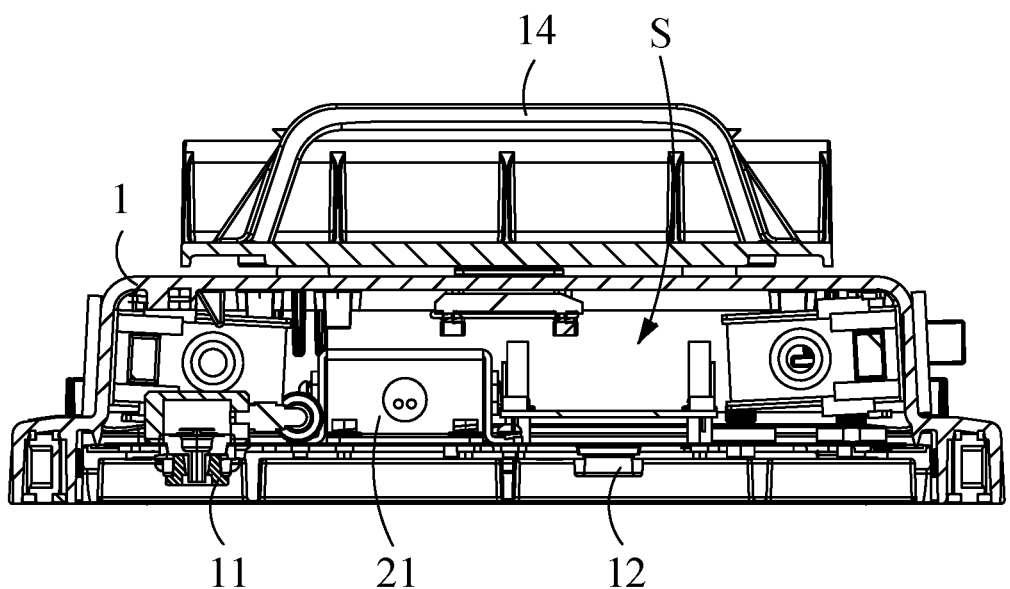
FIG. 3 is a schematic sectional view of the jig for automatically measuring flow rate of the reticle carrier according to an embodiment of the present disclosure.
Figure 4:
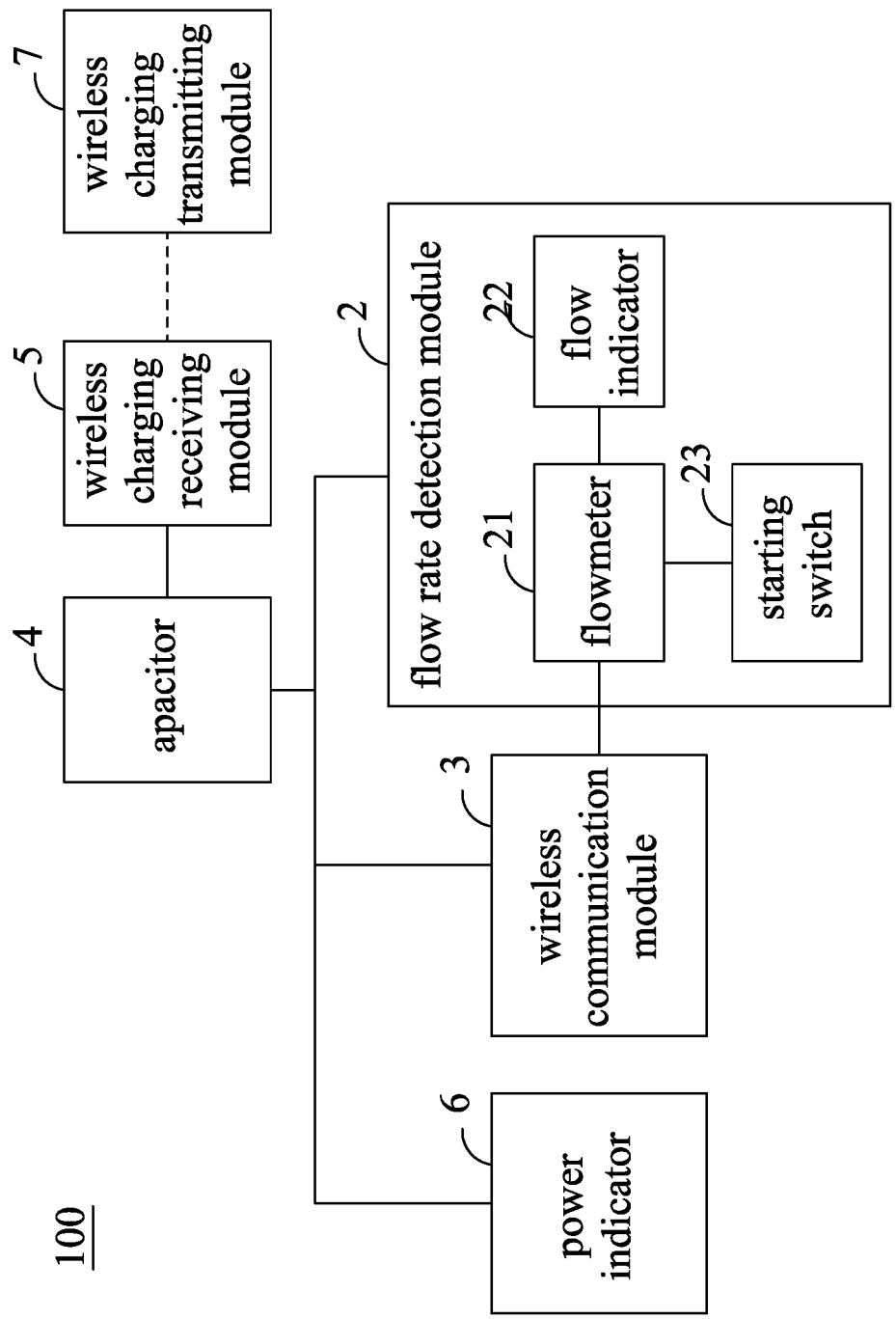
FIG. 4 is a schematic block diagram of the jig for automatically measuring flow rate of the reticle carrier according to an embodiment of the present disclosure.

Further, as shown in FIG. 2, the jig 100 for automatically measuring flow rate of the reticle carrier further comprises the wireless charging transmitting module 7, electrically connected to the wireless charging receiving module 5 in a wireless manner. The wireless charging transmitting module 7 may be disposed on an inflating disk P (communicated to the gas supply source), and the inflating disk P is provided with a plurality of blowers P1 thereon, respectively blowing gas to the gas inlet holes 11, or receiving exhaust from the gas outlet holes 12. When the jig 100 for automatically measuring flow rate of the reticle carrier is loaded on the inflating disk P, the gas supply source injects gas into the storage space S of the jig body 1 through the inflating disk P, and the wireless charging transmitting module 7 is in close proximity opposite to the wireless charging receiving module 5, so that the wireless charging receiving module 5 efficiently uses the principles of electromagnetic induction to charge the capacitor 4.

Further, the flow rate detection module 2 further comprises a starting switch 23, connected to the flowmeter 21 by a signal. The starting switch 23 may be a mechanical trigger switch to turn on/off the flowmeter 21, or may be electrical or other types of switches. The starting switch 23 may also be further linked to the flow indicator 22 to turn on/off the flow indicator 22.

Further, the jig body 1 is further provided with a wired charging interface 13, the wired charging interface 13 is, for example, a universal serial bus (USB) interface, or a conventional wired power transmission interface. The capacitor 4 may be connected to a charging source in a wired manner via the wired charging interface 13 as an auxiliary charging method.

While the present invention has been described by means of specific embodiments, those skilled in the art should understand the above description is merely embodiments of the invention, and it should not be considered to limit the scope of the invention. It should be noted that all changes and substitutions which come within the meaning and range of equivalency of the embodiments are intended to be embraced in the scope of the invention. Therefore, the scope of the invention is defined by the claims.

What is claimed is:

1. A jig for automatically measuring flow rate of a reticle carrier, comprising:
   a jig body, having a storage space, at least one gas inlet hole and at least one gas outlet hole communicated to the storage space;
   a flow rate detection module, including a flowmeter and a flow indicator electrically connected to the flowmeter, the flowmeter is disposed in the storage space;
   a wireless communication module, connected to the flowmeter;
   a capacitor, electrically connected to the flow rate detection module and the wireless communication module; and
   a wireless charging receiving module, disposed at a bottom of the jig body, and electrically connected to the capacitor.

2. The jig for automatically measuring flow rate of the reticle carrier according to claim 1, further comprising a power indicator, electrically connected to the capacitor.

3. The jig for automatically measuring flow rate of the reticle carrier according to claim 1, further comprising a wireless charging transmitting module, electrically connected to the wireless charging receiving module in a wireless manner.

4. The jig for automatically measuring flow rate of the reticle carrier according to claim 1, wherein the flow rate detection module further comprises a starting switch, connected to the flowmeter.

5. The jig for automatically measuring flow rate of the reticle carrier according to claim 1, wherein the wireless communication module is a Bluetooth communication module.

6. The jig for automatically measuring flow rate of the reticle carrier according to claim 1, wherein the jig body is provided with a wired charging interface.

7. The jig for automatically measuring flow rate of the reticle carrier according to claim 1, wherein a top of the jig body is provided with a handle.

\* \* \* \* \*